United States Patent [19]
Nagaya et al.

[11] Patent Number: 5,734,298
[45] Date of Patent: Mar. 31, 1998

[54] FET AMPLIFYING CIRCUIT WHICH CAN IMPROVE LOW-CONSUMPTIVE CURRENT

[75] Inventors: Setsuya Nagaya, Sapporo; Hideo Sugawara; Tominaga Watanabe, both of Kawasaki, all of Japan

[73] Assignee: Fujitsu Limited, Kanagawa, Japan

[21] Appl. No.: 747,790

[22] Filed: Nov. 14, 1996

Related U.S. Application Data

[62] Division of Ser. No. 387,734, Feb. 16, 1995, Pat. No. 5,648,743.

[30] Foreign Application Priority Data

Aug. 10, 1993 [JP] Japan ............... 5-218070

[51] Int. Cl.⁶ ............... H03F 3/45; H03F 3/16
[52] U.S. Cl. ............... 330/253; 330/301
[58] Field of Search ............... 330/253, 261, 330/277, 301, 311

[56] References Cited

U.S. PATENT DOCUMENTS

| | | |
|---|---|---|
| 4,940,949 | 7/1990 | Landi . |
| 5,068,621 | 11/1991 | Hayward et al. ............... 330/301 X |
| 5,221,909 | 6/1993 | Cole ............... 330/253 |
| 5,389,891 | 2/1995 | Phillipe ............... 330/253 |

FOREIGN PATENT DOCUMENTS

| | | |
|---|---|---|
| 55-72325 | 5/1980 | Japan . |
| 55-104819 | 7/1980 | Japan . |
| 57-155812 | 9/1982 | Japan . |
| 58-168308 | 10/1983 | Japan . |
| 59-104807 | 6/1984 | Japan . |
| 0123210 | 5/1991 | Japan . |

*Primary Examiner*—Steven Mottola
*Attorney, Agent, or Firm*—Helfgott & Karas, P.C.

[57] ABSTRACT

An amplifying circuit is suitable for an integrated circuit that has a characteristic of low-noise, high-gain, and low-consumptive current. In the circuit, transistors or FETs are used as amplifying elements. A basic amplifying circuit employing transistors, that forms a differential pair of first and second transistors, first and second resistors connected to each collector of the first and second transistors, and a constant current source connected to a common emitter of the first and second transistors, comprises a third transistor, of which emitter is connected to a connecting point of the first and second resistors, a condenser connected between a connecting point of the first transistor and the first resistor, or a connecting point of the second transistor and the second resistor, and a base of the third transistor, and a voltage source connected to a collector of the third transistor, wherein outputs are obtained from an emitter of the third transistor.

8 Claims, 16 Drawing Sheets

FET AMPLIFYING CIRCUIT WHICH CAN IMPROVE LOW-CONSUMPTIVE CURRENT

This is a division of application Ser. No. 08/387,734, filed Feb. 16, 1995 now U.S. Pat. No. 5,648,743.

BACKGROUND OF THE INVENTION

1. Field of the Invention

The present invention relates to an amplifying circuit. More particularly, it relates to an amplifying circuit, which is suitable for an integrated circuit with the characteristic of low-noise, high gain and low power consumption.

2. Description of the Related Art

In recent years, movable communication terminals, such as a portable telephone, are spreading extensively. According to this fact, there is a demand for making a circuit of high frequency characteristic used for movable communication terminals, such as a portable telephone, micro-miniaturized. Moreover, there is also a demand for making an amplifying circuit, which has been composed of individual parts integrated.

Further, most of the movable communication terminals, such as a portable telephone, are driven with batteries. Accordingly, it is required to make current consumption smaller for lengthening the life of a battery.

FIG. 19 is one structural example of a conventional transistor amplifying circuit.

In the diagram, a constant-current source $I_0$ and a condenser $C_E$ connected to the constant-current source in parallel are connected to the emitter of a first transistor $Q_1$. Also, a voltage source $V_{CC}$ is connected to the collector of the transistor $Q_1$, via a load-resistor $R_C$. A bias voltage $V_{BB}$ is supplied to the base of the transistor $Q_1$.

Further, the conventional transistor amplifying circuit includes a second transistor $Q_2$, of which the collector is connected to the voltage $V_{CC}$ and the emitter is connected to a resistor $R_E$. Furthermore, an output from the collector of the first transistor $Q_1$ is connected to the base of the second transistor $Q_2$.

Moreover, the base of the transistor $Q_1$ is used as an input terminal of a high-frequency signal, and the emitter of the transistor $Q_2$ is used as an output terminal for the high-frequency signal. In this circuit, the transistor $Q_1$ is an amplifying circuit of an emitter grounded type, and the transistor $Q_2$ forms an emitter follower circuit for matching impedance with the circuit arranged behind the emitter follower circuit.

FIG. 20 further illustrates a structural example of the conventional transistor amplifying circuit including a bias circuit section 21. As is apparent from FIG. 20, the transistor amplifying circuit is composed of an amplifying circuit section 20 and the bias circuit section 21 for supplying a bias voltage required to each portion of the amplifying circuit.

In FIG. 20, the amplifying circuit section 20 corresponds to the transistor amplifying circuit shown in FIG. 19. The circuit section includes a transistor $Q_3$ and a resistor $R_{E1}$, instead of the current source $I_0$ shown in FIG. 19, and a transistor $Q_4$ and a resistor $R_{E2}$, instead of the resistor $R_E$ shown in FIG. 19.

The bias circuit section 21 shown in FIG. 20 supplies bias current sources, that is, base potential of the transistors $Q_1$, $Q_2$, $Q_3$, and $Q_4$, required for the amplifying section 20 positioned on the right side of the circuit. The bias circuit section 21 is composed of a 2-line structured constant current circuit which lays three transistors $Q_{B1}$ to $Q_{B3}$, and $Q_{B4}$ to $Q_{B6}$ lengthwise, respectively. Further, the transistors $Q_{B2}$ to $Q_{B3}$ and $Q_{B5}$ to $Q_{B6}$ function as diodes by connecting the bases and the collectors in common.

Meanwhile, in the transistor amplifying circuit of an emitter grounded type shown in FIGS. 19 and 20, noise figure (NF) of the circuit is generally proportional to the base resistor $R_b$ of the transistor used. Further, it is generally known that noise figure (NF) is inversely proportional to the second power of $f_t$ (cutoff frequency) of a transistor.

In FIGS. 19 and 20, a resistor $R_C$ is a collector load resistor of the transistor $Q_1$, which is an amplifying element. At the same time, the resistor $R_C$ also has a function for dropping the voltage to a suitable base potential of the transistor $Q_2$ of an emitter follower circuit, which follows the transistor $Q_1$.

In the above-described transistor amplifying circuit shown in FIGS. 19 and 20, collectors of the transistors $Q_1$ and $Q_2$ are connected to the voltage $V_{CC}$, respectively. Therefore, a consumptive current of the amplifying circuit becomes the sum $(I_1+I_2)$ of the current $I_1$ flowing into the transistor $Q_1$ and the current $I_2$ flowing into the transistor $Q_2$.

Thus, when making the consumptive current lower in this circuit, it becomes necessary to reduce both the current $I_1$ and the current $I_2$. Accordingly, it causes a problem that performance is not fulfilled enough in the case where the circuit is used as an amplifying circuit. Or, it causes another problem that the consumptive current becomes large, in the case where satisfactory performance is obtained.

It also becomes necessary to have two rows of the circuits forming the bias circuit section 21, in FIG. 20. Therefore, the consumptive current in the bias circuit section 21 becomes the sum $(I_{B1}+I_{B2})$ of the currents $I_{B1}$ and $I_{B2}$, which respectively flow to each of constant current circuits, as well as in the amplifying section 20. Accordingly, the circuit is not suitable to make the current lower.

Further, the base resistor $R_b$ of the grounded-emitter type transistor $Q_1$ is practically determined according to the physical forms of individual transistors in general. Furthermore, the cutoff frequency $f_t$ is also determined according to the semiconductor process technique for manufacturing the transistors.

If the current of the transistor amplifying circuit becomes lower, there is a tendency that the cutoff frequency $f_t$ becomes lower and the noise figure NF becomes worse.

The $V_{ce}$ (voltage between the collector and the emitter) of the transistor $Q_1$ becomes smaller because of the voltage drop with the load resistor $R_c$. It is generally known that the cutoff frequency $f_t$ of a transistor becomes lower, if the $V_{ce}$ becomes smaller. Therefore, it is desirable to make the $V_{ce}$ of the transistor large as much as possible, more particularly, in the case where a high-frequency circuit is required.

In another mode, an amplifying circuit is composed of a differential pair of transistors. FIG. 21 is a diagram showing one example of a conventional differential amplifying circuit composed by the differential pair of transistors.

In the diagram, the emitters of the pair of transistors $Q_{11}$ and $Q_{12}$ are connected in common, and connected to the constant current source $I_0$. Further, the collectors of both transistors $Q_{11}$ and $Q_{12}$ are connected to the load resistors $R_{C1}$ and $R_{C2}$, respectively. Furthermore, the load resistors $R_{C1}$ and $R_{C2}$ are connected to the voltage source $V_{CC}$.

In the differential amplifying circuit having the above-described structure, the current $I_{C1}$ is flowing to the collector of the transistor $Q_{11}$ and the current $I_{C2}$ is flowing to the collector of the transistor $Q_{12}$ according to the structure. If the current $I_{C1}$ is equal to the current $I_{C2}$, twice the amount of current is flowing in comparison with the circuit having a single-end structure formed in the transistor $Q_1$ shown in FIG. 19.

If the current is reduced, the output driving ability becomes lower. When the low impedance load is further connected, the circuit deteriorates in regard to this characteristic thereof. Accordingly, as shown in FIG. 22, another transistor $Q_{13}$ is connected to be an emitter follower, same as the conventional circuit shown in FIG. 19. There have been frequent cases where the load of the differential amplifying circuit is reduced in this way.

However, the consumptive current becomes larger, in either case when the current flows larger to the differential amplifying circuit, and that the emitter follower circuit is connected to reduce the current of the differential amplifying circuit.

Further, in the above-described explanation of the prior art, the amplifying circuit is explained as formed by the transistors. In contrast, FIG. 23 shows a prior art differential amplifying circuit formed by FETs (Field Effect Transistors).

The differential pair is formed by the source terminals of two FETs $T_{11}$ and $T_{12}$ being mutually connected. Further, the commonly connected source terminals are grounded via the constant current source $I_0$. The constant current source $I_0$ controls the sum ($I_{11}+I_{12}$) of the currents flowing from the drain voltage $V_{d1}$ to two FETs $T_{11}$ and $T_{12}$ so as to become constant.

The gate terminals of the FETs $T_{11}$ and $T_{12}$ are a non-inverse input terminal I and an inverse input terminal /I (Hereinafter used /I as a meaning of inversion of I), respectively, and the terminals are similarly connected to the gate bias voltage $V_g$.

The drain terminals of the FETs $T_{11}$ and $T_{12}$ are connected to the drain voltage $V_{d1}$ via the resistors $R_{11}$ and $R_{12}$, respectively. Simultaneously, the drain terminals are connected to the gate terminals of the FETs $T_{13}$ and $T_{14}$, respectively.

The drain terminals of the FETs $T_{13}$ and $T_{14}$ are connected to the drain voltage $V_{d2}$, respectively. Further, the source terminals of the FETs $T_{13}$ and $T_{14}$ are grounded via the resistors $R_{13}$ and $R_{14}$, respectively, and simultaneously become a non-reverse output O and an inverse output /O (Hereinafter used /O as a meaning of inversion of O), respectively.

In this way, it is a feature of the differential amplifying circuit to be symmetrical. The FETs are also configured to be symmetrical, and the current $I_{11}$ flowing to the FET $T_{11}$ is equal to the current $I_{12}$ flowing to the FET $T_{12}$. Simultaneously, the current $I_{13}$ flowing to the FET $T_{13}$ becomes equal to the current $I_{14}$ flowing to the FET $T_{14}$.

In the conventional circuit, the part composed of the FETs $T_{11}$ and $T_{12}$, the constant current source $I_0$ and the resistors $R_{11}$ and $R_{12}$ is a basic differential amplifying circuit. The FETs $T_{13}$ and $T_{14}$ form source follower circuits for matching the output impedance.

Here, the reason for providing the source follower circuit is the same as explained in the conventional circuit shown in FIGS. 19 and 22. More particularly, it is general to use the characteristic impedance of 50 ohms when connecting high frequency circuits. However, the differential amplifying circuit has a high output impedance, so that an amplified signal cannot be outputted effectively, if the output terminal of the amplifying circuit is connected to a circuit having the characteristic impedance of 50 ohms, as it is. Therefore, the source follower circuit is required for conversing the impedance.

In such a FET differential amplifying circuit, the difference of two high-frequency signals inputted to the non-inverse input terminal I and the inverse input terminal /I is amplified to output to the non-inverse output terminal O and the inverse output terminal /O, respectively.

The signals outputted from the non-inverse output terminal O and the inverse output terminal /O have phases reversed with same amplitude.

FIG. 24 is a diagram showing the structure of an amplifying circuit formed by using the differential amplifying circuit shown in FIG. 23. As compared with the circuit shown in FIG. 23, the constant current source $I_0$ is replaced with the resistor $R_{17}$, and it is grounded via the resistors $R_{15}$ and $R_{16}$ instead of the gate bias voltage $V_g$. Accordingly, the circuit is realized as a self-biasing system.

According to the FET differential amplifying circuit having the structure shown in FIG. 24, it becomes possible to amplify and output high-frequency signals supplied to the non-inverse input terminal I and the inverse input terminal /I from the non-inverse output terminal O and the inverse output terminal /O, stably.

However, the FETs $T_{12}$ and $T_{14}$ are connected to the drain voltages $V_{d1}$ and $V_{d2}$, respectively, as well as the FETs $T_{11}$ and $T_{13}$ in the FET differential amplifying circuit shown in FIGS. 23 and 24. Therefore, the consumptive current becomes a total of the sum ($I_{11}+I_{13}$) of the currents flowing to the FETs $T_{11}$ and $T_{13}$ and the sum ($I_{12}+I_{14}$) of the currents flowing to the FETs $T_{12}$ and $T_{14}$.

Accordingly, the consumptive current of the circuit becomes larger. In such as an amplifying circuit having the above-described structure, it is required to reduce both the sum of $I_{11}+I_{13}$ and the sum of $I_{12}+I_{14}$, in order to make the consumptive current lower. Consequently, it causes a problem that the circuit does not fulfill its function enough as a differential amplifier because the gain is reduced.

SUMMARY OF THE INVENTION

Accordingly, it is an object of the present invention to provide an amplifying circuit, which is suitable for an integrated circuit with the characteristic of high gain, low-noise and low-current consumption, without losing its amplifying function and thus can overcome the problems which are commonly brought to the conventional amplifiers as described above in detail.

It is another object of the present invention to provide a transistorized amplifying circuit composed of transistors, which can have a low current consumption.

It is still another object of the present invention to provide a differential amplifying circuit forming a differential pair with a pair of transistors, which is suitable for an integrated circuit with a low current consumption.

It is a further object of the present invention to provide a FET differential amplifying circuit suitable for an integrated circuit (MMIC) that is low-noise and can make the consumptive current lower.

The transistor amplifying circuit according to the present invention has a basic structure as follows;

The circuit comprises a first transistor ($Q_2$) having a base of an input terminal, to which a first base bias ($V_{B1}$) is supplied; a second transistor ($Q_2$) having a collector connected to a voltage source ($V_{CC}$); a base supplied with a second base bias ($V_{B2}$) and an emitter of an output terminal (OUT); a parallel circuit of a constant current source ($I_0$) connected to an emitter of the first transistor ($Q_1$) and a first condenser ($C_E$); an inductor ($l_c$) connected between a collector of the first transistor ($Q_1$) and an emitter of the second transistor ($Q_2$); and a second condenser ($C_c$) connected between the collector of the first transistor ($Q_1$) and the base of the second transistor ($Q_2$).

Further, the transistor differential amplifying circuit according to the present invention has a basic structure as follows;

The circuit comprises a differential pair including first and second transistors, first and second resisters connected to collectors of the first and second transistors and a constant current source connected commonly to emitters of the first and second transistors, a third transistor, an emitter of which is connected to a connection point of the first and second inductors; a first condenser connected between the collector of the first transistor and a baser of the third transistor; and a voltage source connected to the collector of the third transistor, an output being outputted form the emitter of the third transistor.

Furthermore, the FET differential amplifying circuit according to the present invention has a basic structure as follows;

The circuit comprises a differential pair including first and second FETs; first and second resisters respectively connected to drains of the first and second FETs and a constant current source connected between a commonly connected source of the first and second FETs and ground; third and fourth FETs, drains of which are respectively connected to the first and second resisters; a voltage source connected to sources of the first and fourth FETs; and a gate bias source for supplying gate biases to the gates of the first and second FETs; the drain of the first FET being connected to the gate of the third FET, the drain of the second FET being connected to the gate of the fourth FET and the gates of the first and second FETs being supplied with a non-inverted input and an inverted input, respectively.

Other objects and advantages of the present invention will become apparent from the detailed description to follow taken in conjunction with the appended claims.

BRIEF DESCRIPTION OF THE DRAWINGS

The accompanying drawings, which are incorporated in and constitute a part of the specification, illustrate presently preferred embodiments of the invention, and together with the general description given above and detailed description of the preferred embodiments to follow, explain the principle of the invention.

DESCRIPTION OF THE PREFERRED EMBODIMENTS

Figure 1:
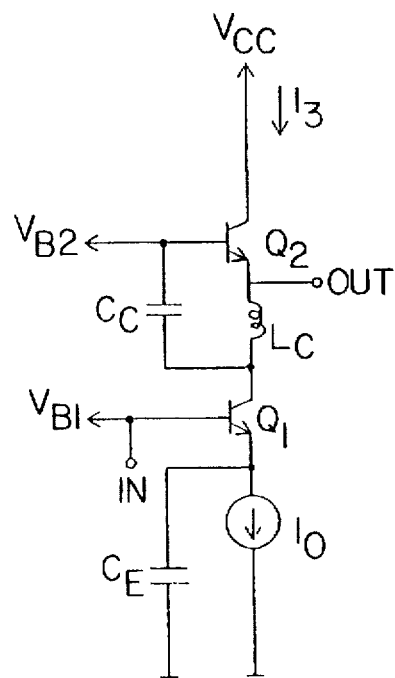
FIG. 1 is a schematic diagram showing a first embodiment of a transistor amplifying circuit according to the present invention.

FIG. 1 is a schematic diagram showing a first embodiment of a transistor amplifying circuit according to the present invention.

In FIG. 1, the circuit has a first transistor $Q_1$ and a second transistor $Q_2$. The transistors $Q_1$ and $Q_2$ are laid lengthwise and are directly connected for a direct current.

A constant current source $I_0$ is connected to an emitter of the first transistor $Q_1$, and a condenser $C_E$ is connected to the emitter of the first transistor $Q_1$ in parallel. A collector of the transistor $Q_1$ is connected to an emitter of the transistor $Q_2$ via a load inductor $L_C$.

Further, the collector of the first transistor $Q_1$ is connected to a base of the second transistor $Q_2$ via a condenser $C_C$. The condenser $C_C$ has a function for separating the collector of the transistor $Q_1$ from the base of the transistor $Q_2$ for a direct current, and connecting them for an alternating current.

The collector of the transistor $Q_2$ is connected to a voltage source $V_{CC}$, and the base of the transistor $Q_2$ is connected to a bias voltage $V_{B2}$. Further, the base of the transistor $Q_1$ is connected to a bias voltage $V_{B1}$.

Furthermore, a signal of a high-frequency is input to the input terminal IN, that is, the base of the transistor $Q_1$. The high-frequency output which is amplified is supplied from the collector of the transistor $Q_1$ via the condenser $C_C$ to the base of the transistor $Q_2$, and is outputted from the emitter of the transistor $Q_2$.

In this circuit, the transistor $Q_1$ forms a grounded-emitter type amplifying circuit, and the transistor $Q_2$ forms a grounded-collector type emitter follower amplifying circuit. Further, the inductor $L_C$ becomes a collector load of the transistor $Q_1$.

More particularly, in the circuit according to the present embodiment, the inductor $L_C$ has a high impedance for the frequency that is used. Therefore, the signal amplified by the transistor $Q_1$ can be supplied to the base of the transistor $Q_2$ effectively. Accordingly, a loss at high frequency can be prevented.

Further, there is no drop of the direct voltage in the inductor $L_C$, so that a voltage $V_{ce}$ between the collector and the emitter of the transistor $Q_1$ can be maintained. Therefore, the transistor can be operated without losing the original performance of the transistor.

Figure 19:
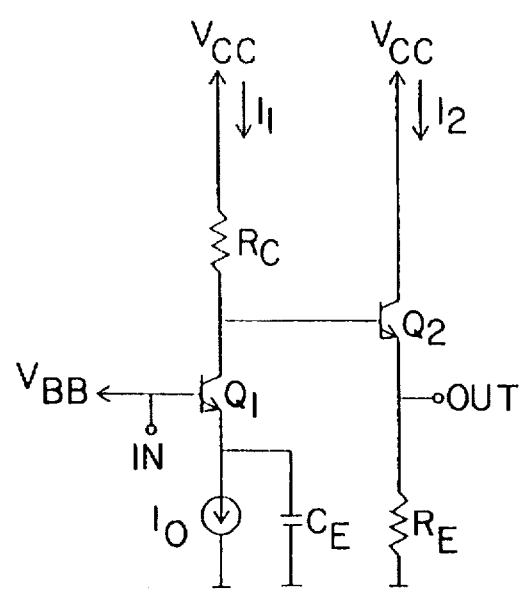
FIG. 19 is a first conventional circuit of a transistor amplifying circuit.
Figure 21:
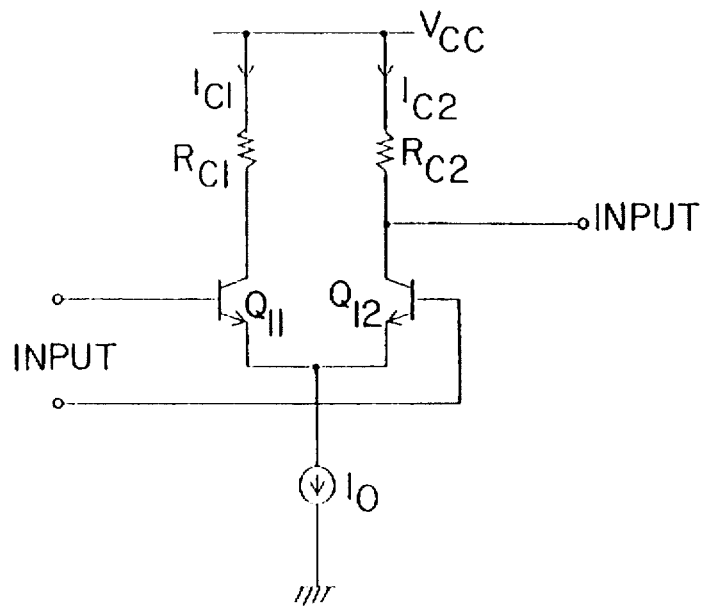
FIG. 21 is a first conventional circuit of a transistor differential amplifying circuit.

Furthermore, only one circuit is connected to the voltage source $V_{CC}$ as a result by laying the transistors $Q_1$ and $Q_2$ lengthwise in a line, as described above. It becomes possible to make a current $I_3$ flowing to the whole circuit less than the sum of the consumptive currents $I_1$ and $I_2$ of the conventional circuit shown in FIGS. 19 and 21.

Figure 2:
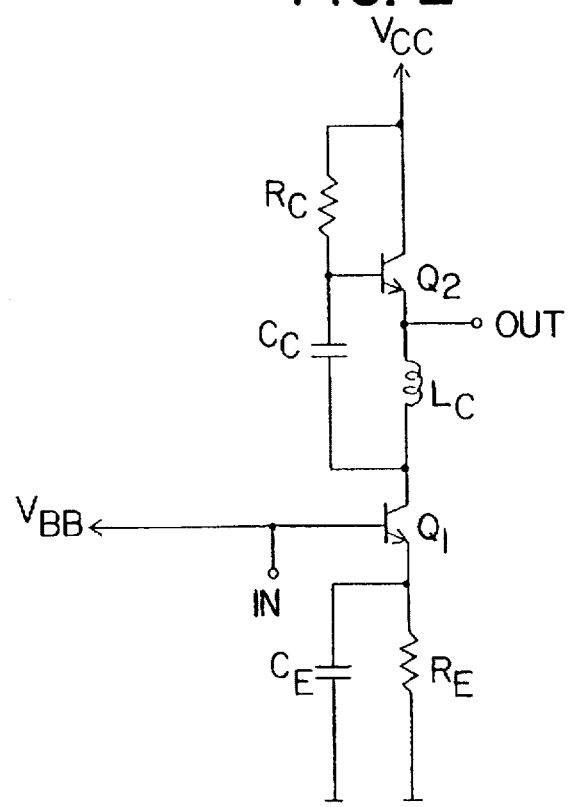
FIG. 2 is a schematic diagram showing a second embodiment of a transistor amplifying circuit according to the present invention.

FIG. 2 shows a second embodiment of a transistor amplifying circuit according to the present invention. As compared with the embodiment shown in FIG. 1, a bias voltage is provided at the base of the transistor $Q_2$ by connecting the base to the voltage source $V_{CC}$ via a resistor $R_C$. Further, the constant current source $I_0$ is formed by the resistor $R_E$.

This circuit is used in the case where it can be operated even if the base potential of the transistor $Q_2$ is higher to some extent. Further, two voltage sources $V_{CC}$ and $V_{BB}$ can supply the bias required for the whole circuit. Therefore, no bias circuit for the base bias of the transistor $Q_2$ is necessary, the circuit can be miniaturized, and further, the current of the circuit can be made lower.

Figure 3:
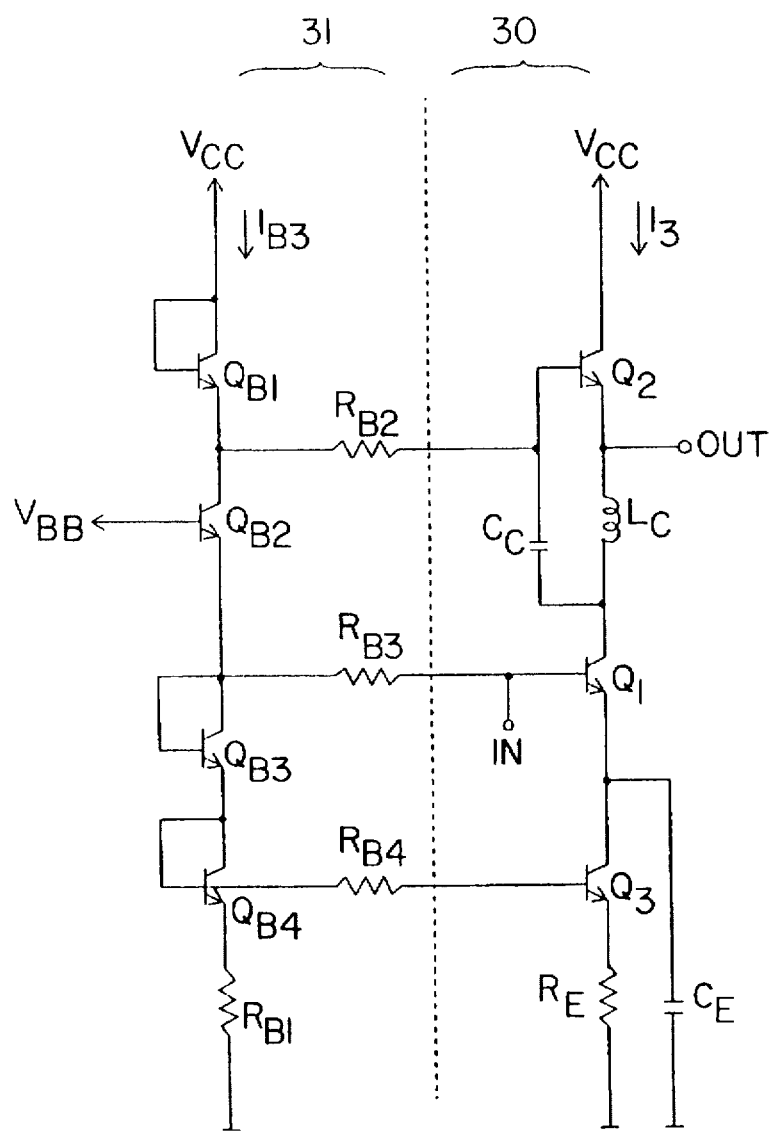
FIG. 3 is a schematic diagram showing a third embodiment of a transistor amplifying circuit having a bias circuit section according to the present invention.

FIG. 3 shows a third embodiment of a transistor amplifying circuit according to the present invention. This circuit has a bias circuit section 31 for supplying required bias voltages on the basis of the transistor amplifying circuit shown in FIG. 1.

In the transistor amplifying circuit section 30, the constant current source $I_0$ is composed of a third transistor $Q_3$ and a resistor $R_E$, on the basis of the amplifying circuit shown in FIG. 1.

Consequently, the circuit requires the bias source for supplying the bias voltage to the base of the transistors $Q_1$, $Q_2$, and $Q_3$. The bias circuit section 31 becomes the bias source.

In this bias circuit section 31, each base of the transistors $Q_{B1}$, $Q_{B3}$, and $Q_{B4}$ is connected to each collector of the transistors. Therefore, the transistors function as diodes for shifting voltage.

Further, the transistor $Q_{B2}$ is provided between the transistors $Q_{B1}$ and $Q_{B3}$. The base of the transistor $Q_{B2}$ is supplied with a constant voltage $V_{BB}$ from a bias supplying circuit, not shown in the diagram.

In this bias circuit section 31, the constant voltage source $V_{BB}$ is supplied to the base of the transistor $Q_{B2}$. The transistors $Q_{B1}$, $Q_{B3}$, and $Q_{B4}$ generate voltages required, as voltage level shift circuits, respectively. Accordingly, the required bias voltages are supplied via base bias resistors $R_{B2}$ to $R_{B4}$, to the corresponding bases of the amplifying circuit section 30, which is composed of the transistors $Q_1$, $Q_2$ and $Q_3$ connected lengthwise.

Figure 20:
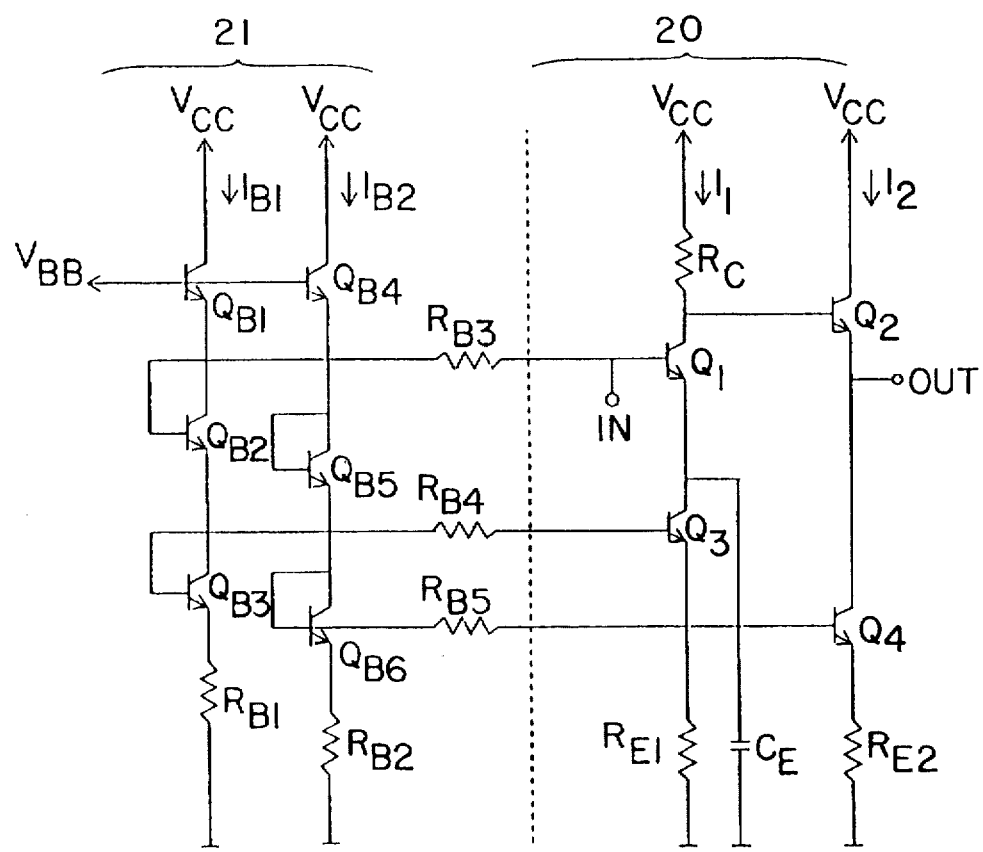
FIG. 20 is a second conventional circuit of a transistor amplifying circuit having a bias circuit section.

In this way, only one line is connected to the voltage source $V_{CC}$ at last, in the bias circuit section 31, by making the bias circuit section 31 have the structure of laying lengthwise in a line as well as the amplifying circuit section 30. Therefore, it becomes possible that the current $I_{B3}$ flowing to the circuit is reduced less than the sum of the consumptive currents $I_{B1}$ and $I_{B2}$ shown in the conventional bias circuit section 21 of FIG. 20.

Figure 4:
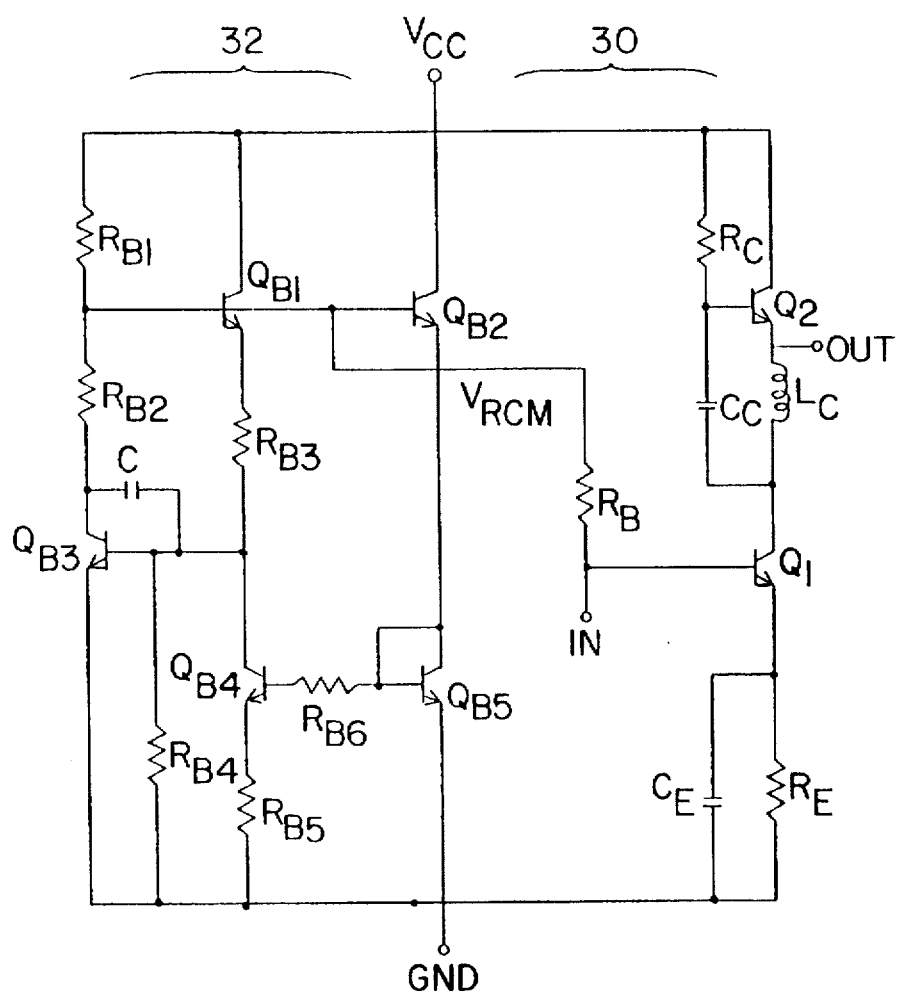
FIG. 4 is a schematic diagram showing a fourth embodiment of a transistor amplifying circuit having a bias circuit section according to the present invention.

FIG. 4 shows a fourth embodiment of a transistor amplifying circuit according to the present invention. This circuit has a bias supplying circuit 32 for supplying required bias voltage on the basis of the amplifying circuit including the bias circuit section 31 shown in FIG. 2.

The amplifying circuit section 30 is the same as the circuit shown in the embodiment of FIG. 2. Accordingly, the required bias voltage is only a base bias supplied to the base of the first transistor $Q_1$. The base bias voltage $V_{rem}$ is supplied via the base bias resistor $R_B$ from the bias supplying circuit 32 to the base of the transistor $Q_1$.

In the embodiment shown in FIG. 4, only one base bias voltage may be supplied, so that there is no need to use the bias circuit section 31 that forms a level shift circuit as explained in the embodiment shown in FIG. 3 above. This circuit includes only a bias supplying circuit 32 that functions as a constant voltage supplying circuit.

Figure 5:
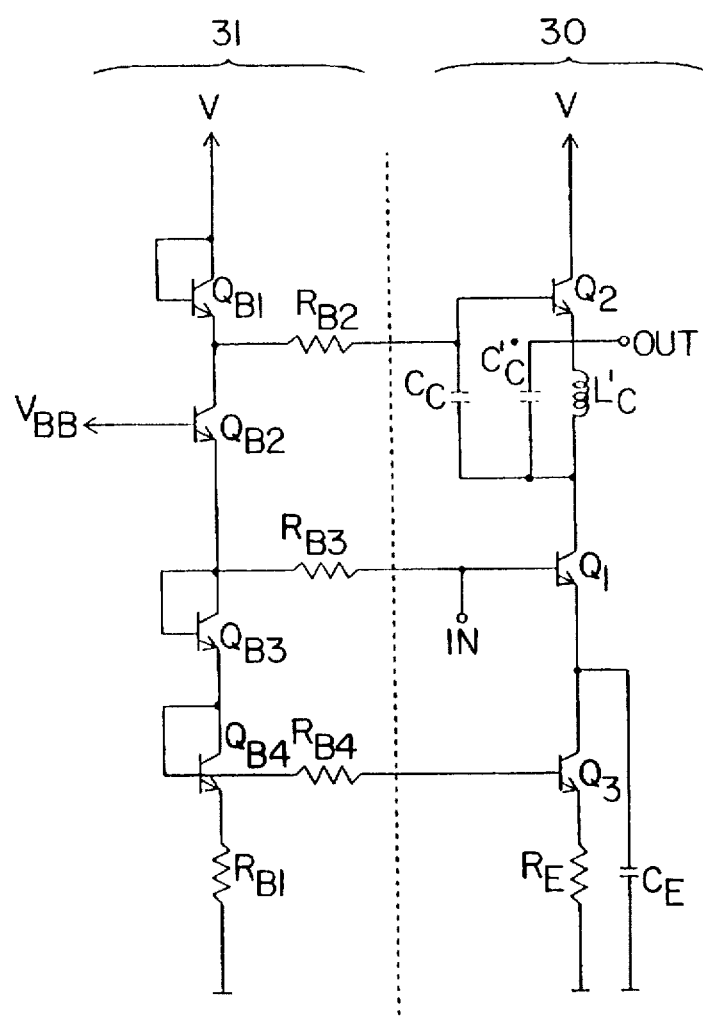
FIG. 5 is a schematic diagram showing a fifth embodiment of a transistor amplifying circuit having a bias circuit section according to the present invention.

FIG. 5 shows a fifth embodiment of a transistor amplifying circuit according to the present invention. The circuit has a bias circuit section 31. The bias circuit section 31 has the same structure as one of the circuit 31 shown in the embodiment of FIG. 3.

It is a different point between this embodiment and the embodiment shown in FIG. 3 to improve efficiency by forming a resonant tank circuit with a condenser $C'_C$ and an inductor $L'_C$, instead of the inductor $L_C$ that is inserted to the emitter of the second transistor $Q_2$ in the amplifying circuit section 30. The other structure of this circuit is the same as one of the embodiment shown in FIG. 3.

It will be apparent from the above-described embodiment that the transistor amplifying circuit according to the present invention is suitable for an integrated circuit. More particularly, in the case where the transistor amplifying circuit according to the present invention is incorporated in an integrated circuit, the following advantages can be obtained by making the size of emitter $E_{Q1}$ of the transistor $Q_1$ larger than the size of emitter $E_{Q2}$ of the transistor $Q_2$.

That is, emitter current density becomes smaller and further the base resistor $R_b$ that is determined according to a physical form is reduced, if the size of the emitter of the transistor is made larger. Therefore, the noise figure NF of the circuit becomes better.

Further, the size of the emitter $E_{Q2}$ is made smaller than the size $E_{Q1}$ to make the circuit high impedance for the voltage $V_{CC}$ and prevent the circuit loss of the high frequency. Therefore, it is possible to keep the NF of the amplifying circuit suitable, even if the current is made lower in the circuit, although it is general that the ft is lowered, and the noise figure NF deteriorates when the current of the transistor is decreased.

Figure 6:
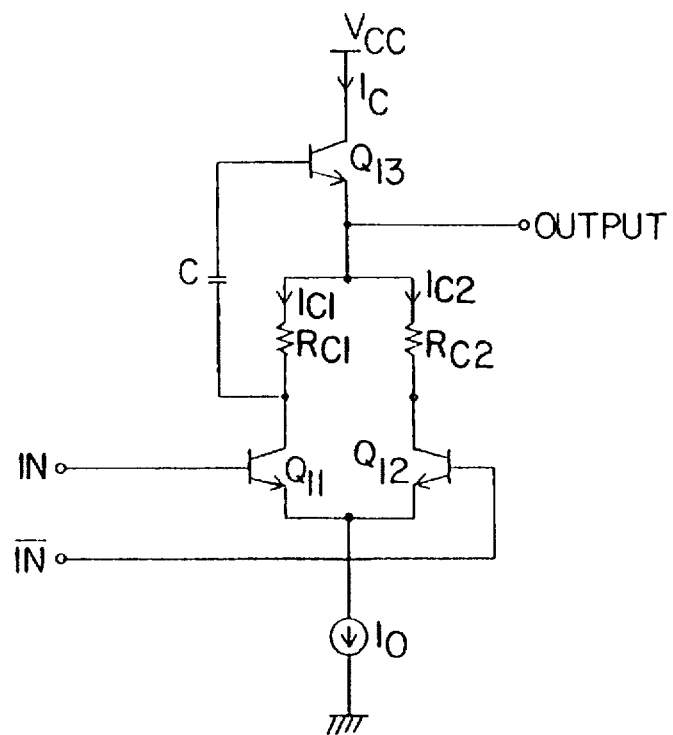
FIG. 6 is a schematic diagram showing a first embodiment of a transistor differential amplifying circuit according to the present invention.

Next, FIG. 6 shows a first embodiment of a transistor differential amplifying circuit according to the present invention. As compared with the conventional transistor differential amplifying circuit shown in FIG. 22, the constant current source $I_0$ is connected to a common emitter of the transistors $Q_{11}$ and $Q_{12}$.

Further, a resistor $R_{C1}$ connected to a collector of the transistor $Q_{11}$ is connected to a resistor $R_{C2}$ connected to a collector of the transistor $Q_{12}$ in common. A transistor $Q_{13}$ forming a buffer circuit is connected between commonly connected resistors $R_{C1}$ and $R_{C2}$ and the voltage $V_{CC}$ in series for a direct circuit.

Furthermore, a condenser C is connected between the base of the transistor $Q_{13}$ and one of the transistors $Q_{11}$ and $Q_{12}$ that constitute a differential pair, i.e., the collector of the transistor $Q_{11}$. The condenser C cuts off between the base of the transistor $Q_{13}$ and the collector of the transistor $Q_{11}$, for a direct current, or connects them for an alternative current.

Complementary signals, of which amplitudes are the same and phases are reversed, are inputted to the bases of the transistors $Q_{11}$ and $Q_{12}$.

In the circuit explained as above, the current $I_C$ flowing to the transistor $Q_{13}$ that forms the buffer circuit diverts into the transistors $Q_{11}$ and $Q_{12}$ that forms a differential pair, as it is. Therefore, all current becomes $I_C = I_{C1} + I_{C2}$. As compared with $I_C = I_{C1} + I_{C2} + I_{C3}$ in the case of the conventional circuit shown in FIG. 22, the circuit can make the consumptive current lower.

Figure 22:
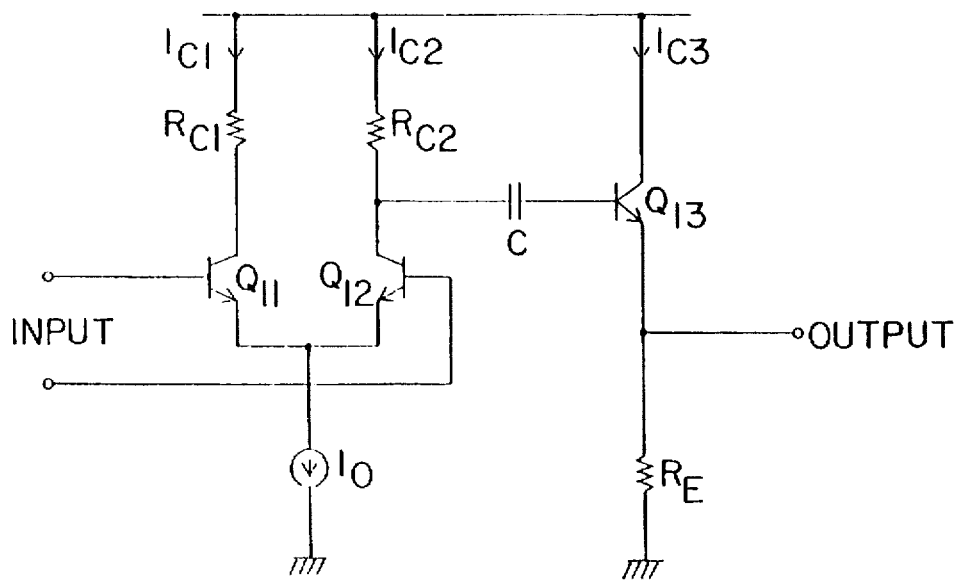
FIG. 22 is a second conventional circuit of a transistor differential amplifying circuit.

Further, it becomes possible that the emitter resistor $R_E$ required in the conventional circuit shown in FIG. 22 is omitted, so that the structure of the circuit can be made simple.

In the case where transistors of the same emitter size are used as the transistors $Q_{11}$, $Q_{12}$, and $Q_{13}$, the current density of the transistor $Q_{11}$ and $Q_{12}$ become smaller in comparison with that of the transistor $Q_{13}$. Simultaneously, it becomes possible to make the noise figure better.

Furthermore, it becomes possible to obtain an amplifying circuit having a large gain, of which the noise figure is improved by making the emitter size of transistors $Q_{11}$ and $Q_{12}$ larger than the transistor $Q_{13}$.

The transistor $Q_{13}$ does not affect the noise figure, as well. Because of this, it is possible to prevent circuit losses by making the emitter size of the transistor $Q_{13}$ smaller so as to obtain a high impedance for the voltage $V_{CC}$.

Figure 7:
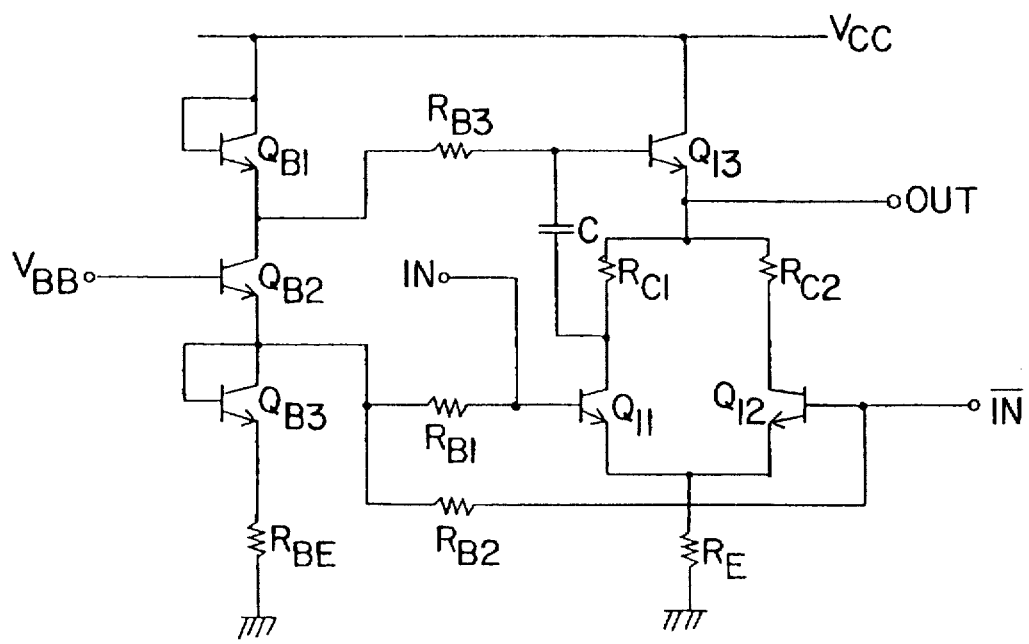
FIG. 7 is a schematic diagram showing a second embodiment of a transistor differential amplifying circuit according to the present invention.

FIG. 7 shows a second embodiment of a transistor differential amplifying circuit according to the present invention. More particularly, it shows a structural example of a transistor differential amplifying circuit provided with a bias circuit section.

Figure 8:
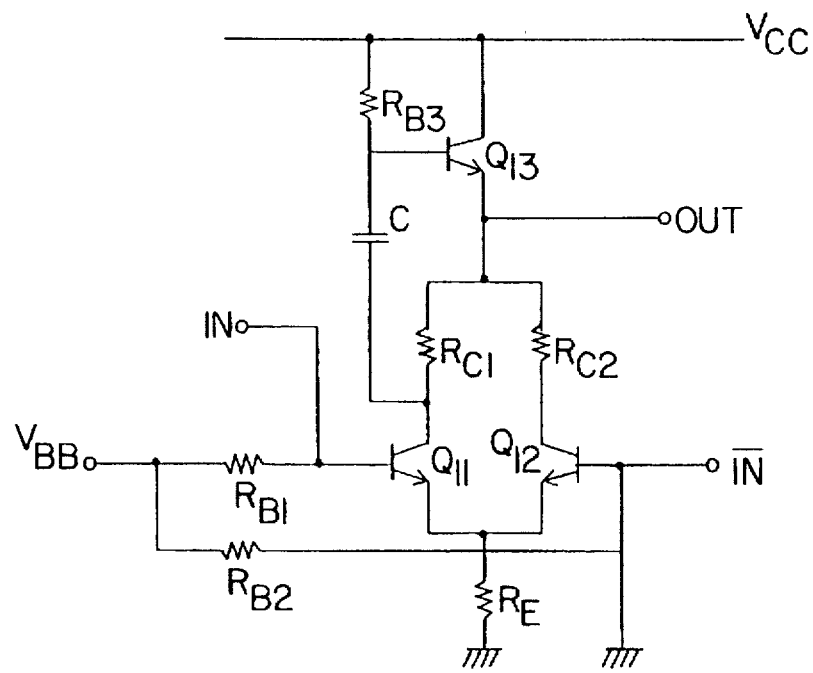
FIG. 8 is a schematic diagram showing a third embodiment of a transistor differential amplifying circuit according to the present invention.

A differential amplifying circuit composed of the transistors $Q_{11}$, $Q_{12}$, and $Q_{13}$ has the same structure as the circuit shown in the embodiment of FIG. 8.

The bias supplying section is composed of a series connection of transistors $Q_{B1}$ to $Q_{B3}$ provided between the voltage $V_{CC}$ and the ground and the resistor $R_{BE}$. The transistors $Q_{B1}$ to $Q_{B3}$ are the elements that generate the base bias voltages, respectively for the corresponding transistors $Q_{11}$ to $Q_{13}$.

Further, the collectors of the transistors $Q_{B1}$ and $Q_{B3}$ are connected to the bases thereof, respectively, to function as diodes for level shift.

Therefore, the base bias voltage are generated from the bias voltage of one constant voltage source $V_{BB}$. Simultaneously, the bias voltages are given via the base resistors $R_{B1}$, $R_{B2}$, and $R_{B3}$ to the bases of the corresponding transistors $Q_{11}$, $Q_{12}$, and $Q_{13}$, respectively.

The bias supplying section in this circuit is also connected to one voltage $V_{CC}$ as well as explained in FIGS. 3 and 5. Accordingly, it becomes possible to make the structure of the circuit simple and make the consumptive current lower.

FIG. 8 shows a third embodiment of the transistor differential amplifying circuit according to the present invention. As compared with the embodiment shown in FIG. 7, the resistor $R_{B3}$ is provided between the base of the transistor $Q_{13}$ and the voltage source $V_{CC}$, without obtaining the base bias of the transistor $Q_{13}$ from the bias supplying section. Therefore, the circuit can be made simple.

That is, the circuit from the transistor $Q_{B1}$ to the resistor $R_{B3}$ in the bias supplying section shown in FIG. 7 is omitted, and it also becomes possible that the current flowing the amplifying circuit is lowered.

Figure 9:
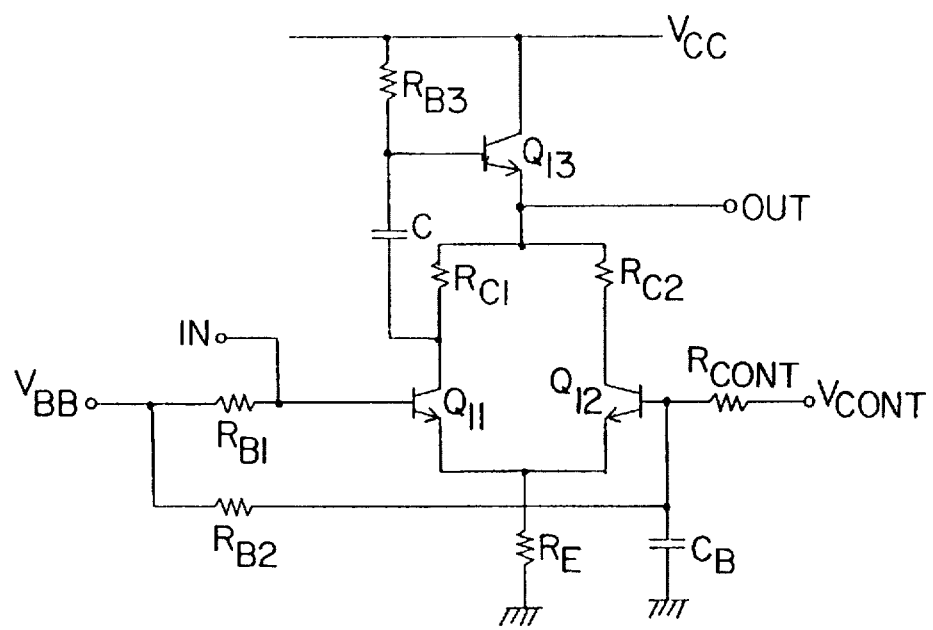
FIG. 9 is a schematic diagram showing a fourth embodiment of a transistor differential amplifying circuit according to the present invention.

FIG. 9 shows a fourth embodiment of a transistor differential amplifying circuit according to the present invention. As compared the embodiment with the circuit shown in FIG. 8, a condenser $C_B$ is provided between the base of the transistor $Q_{12}$ and the ground to short cut the input terminal for high frequency and further, the direct bias is controlled by the control signal $V_{CONT}$ given to the resistor $R_{CONT}$.

Figure 10:
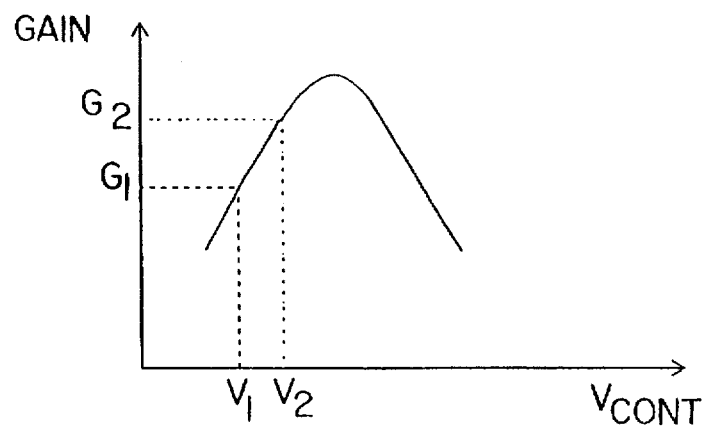
FIG. 10 is a diagram for explaining a control operation of the embodiment shown in FIG. 9.

Accordingly, gain is changed by the variation of the direct bias, so that the circuit forms a variable gain amplifying circuit, the gain of which is converted by the control signal $V_{CONT}$. As shown in FIG. 10, the gain is changed from $G_1$ to $G_2$, by changing the control signal $V_{CONT}$ from $V_1$ to $V_2$.

Figure 11:
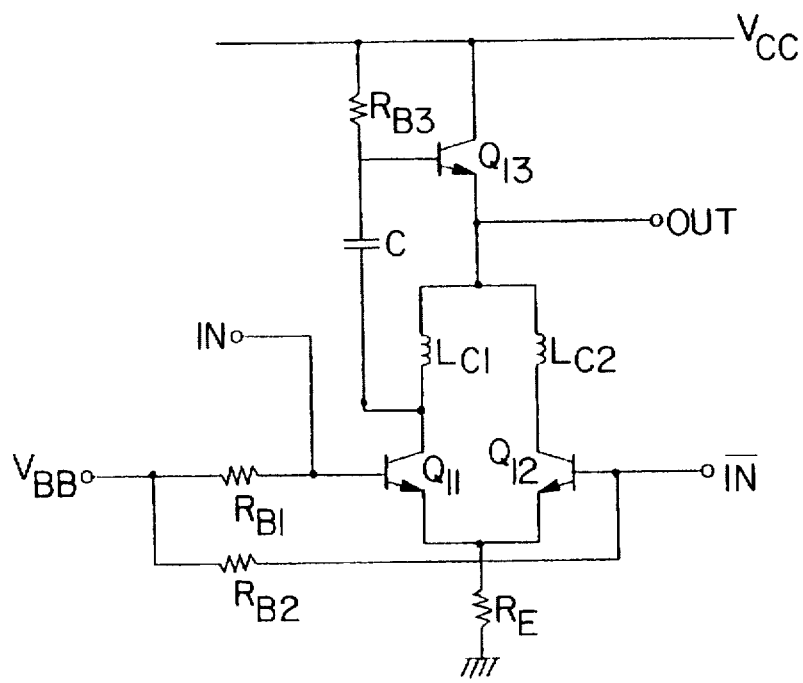
FIG. 11 is a schematic diagram showing a fifth embodiment of a transistor differential amplifying circuit according to the present invention.

FIG. 11 shows a fifth embodiment of a transistor differential amplifying circuit according to the present invention. As compared this embodiment with the embodiment shown in FIG. 8, the collector registers $R_{C1}$ and $R_{C2}$ of a pair of transistors $Q_{11}$ and $Q_{12}$ in the differential amplifying circuit are replaced with the inductors $L_{C1}$ and $L_{C2}$.

Therefore, the direct-current voltage impressed to each transistor becomes larger, so that the high-frequency differential amplifying circuit that can obtain the high output can be formed.

Although the embodiment of the amplifying circuit using the transistors as amplifying elements and a differential amplifying circuit explained, modifications may be made in this invention by using the basic principle in common. For example, a FET can be used as an amplifying element.

Figure 12:
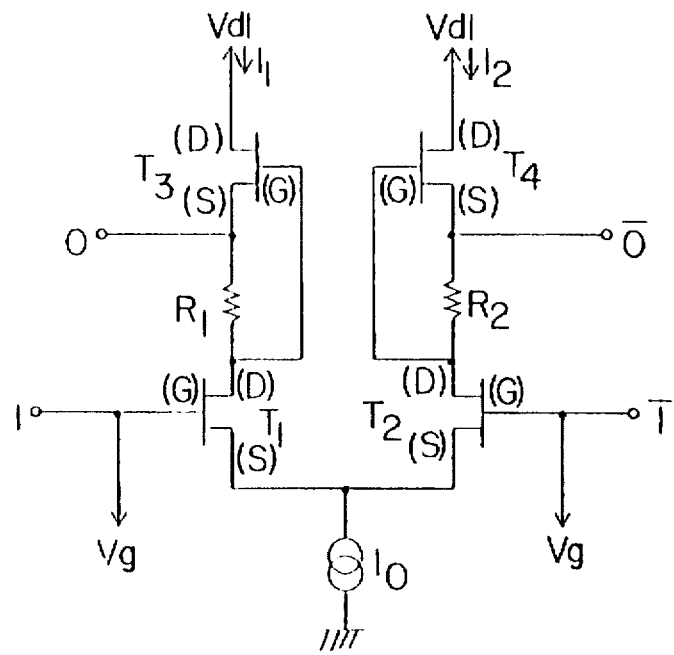
FIG. 12 is a schematic diagram showing a first embodiment of a FET differential amplifying circuit according to the present invention.

FIG. 12 shows a first embodiment of a differential amplifying circuit using FETs according to the present invention.

The FET differential amplifying circuit is composed of a differential pair of two FETs $T_1$ and $T_2$, and FETs $T_3$ and $T_4$ for source follower provided at each drain terminal of the differential pair, which are laid lengthwise in a line, for one voltage $V_{d1}$.

That is, as shown in FIG. 12, the differential pair is formed by commonly connecting each source terminal of two FETs $T_1$ and $T_2$, and the common source terminal connecting the constant current source $I_0$ is grounded.

The gate terminals of the FETs $T_1$ and $T_2$ make the non-inverse input terminal I and the inverse input terminal /I, respectively, and together, the gate terminals are connected to the gate bias voltage $V_g$. The drain terminals of the FETs $T_1$ and $T_2$ are connected to the source terminals of the FETs $T_3$ and $T_4$ via the resistors $R_1$ and $R_2$.

The drain terminals of the FETs $T_3$ and $T_4$ are connected to the voltage $V_{d1}$, respectively. Further, the source terminals of the FETs $T_3$ and $T_4$ become the non-inverse output terminal O and the inverse output terminal /O.

In the FET differential amplifying circuit having such a structure as explained, the FETs $T_1$ and $T_2$ form a differential amplifying circuit, and the FETs $T_3$ and $T_4$ respectively form source follower circuits. Further, the resistors $R_b$ and $R_2$ are drain load resistors of the FETs $T_1$ and $T_2$ for a direct current, respectively. Simultaneously, the load resistors become the source resistors of FETs $T_3$ and $T_4$.

Further, the drain terminals of the FETs $T_1$ and $T_2$ are directly connected to the gate terminals of the FETs $T_3$ and $T_4$, respectively. It is because that a voltage is supplied to the gate terminal in the case of using a FET, so that the current would not flow. Accordingly, each drain terminal of the FETs $T_1$ and $T_2$ becomes the same potential as the gate terminals of the FETs $T_3$ and $T_4$. Therefore, it is different from the embodiment of the amplifying circuit employing the transistors, so that it becomes useless to use any condenser for impeding a direct current.

The signals outputted from the drain terminals of the FETs $T_1$ and $T_2$, such as a high-frequency signal, is supplied to the gate terminals of the FETs $T_3$ and $T_4$ and outputted from the source terminals of the FETs $T_3$ and $T_4$.

Figure 23:
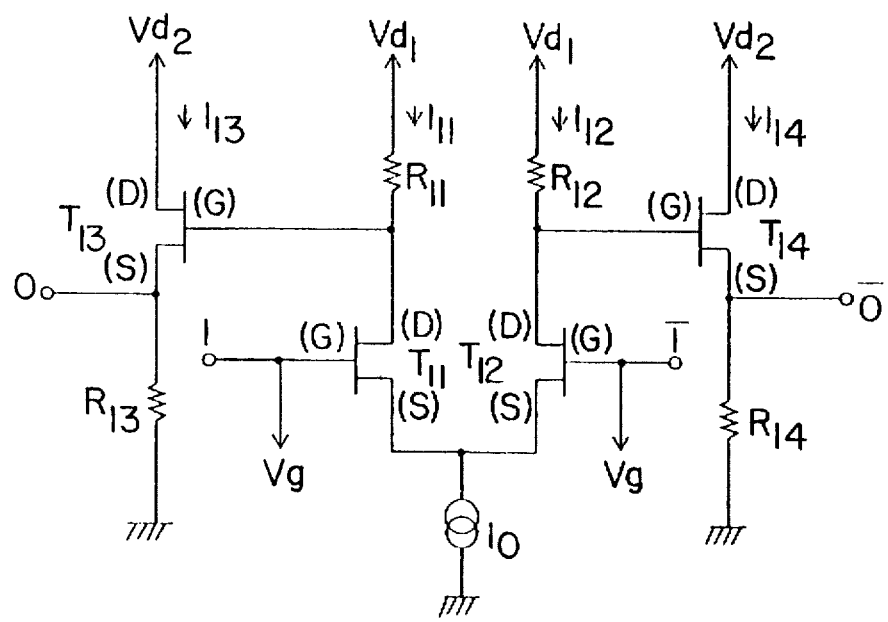
FIG. 23 shows a prior art of a FET differential amplifying circuit.
Figure 24:
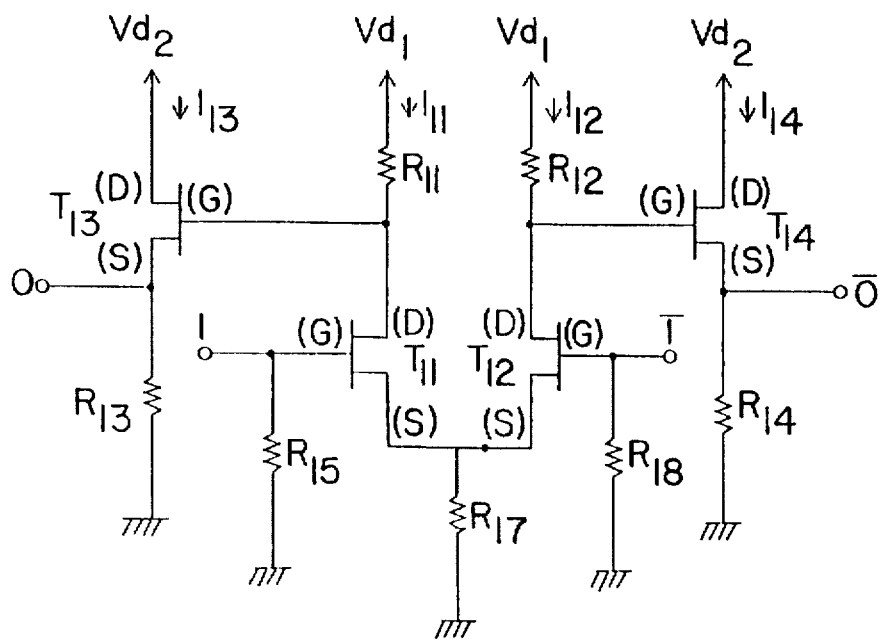
FIG. 24 shows a more concrete structural example of the conventional circuit shown in FIG. 23.

Meanwhile, as described in FIGS. 23 and 24, in the conventional circuit, the voltages $V_{d1}$ and $V_{d2}$ were required for the differential amplifying circuit composed of the FETs $T_1$ and $T_2$ and the source follower circuits composed of the FETs $T_3$ and $T_4$, respectively. Therefore, the consumptive current becomes the sum of the currents $I_{11}$ and $I_{12}$ flowing to the differential amplifying circuit and the currents $I_{13}$ and $I_{14}$ flowing to the source follower circuits.

As compared the FET differential amplifying circuit according to the present invention with the conventional circuit, as described above, the circuit of the present invention is formed by laying the light and the left circuits in the differential amplifying circuit lengthwise in a line, respectively. Accordingly, only one voltage $V_{d1}$ can be used as compared with the circuit shown in FIGS. 23 and 24. Therefore, the current can be reduced to nearly half as used as the currents $I_1$ and $I_2$ flowing the circuit.

Figure 13:
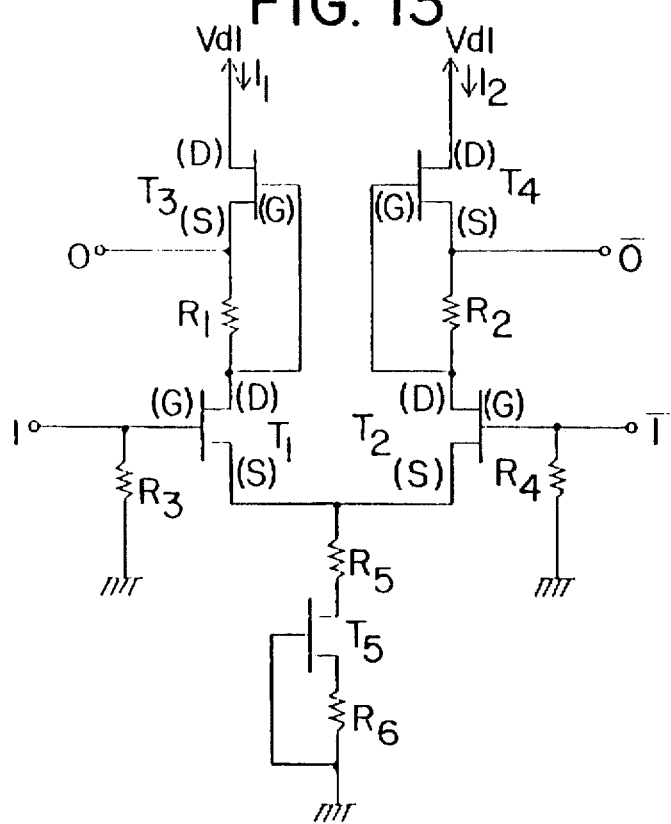
FIG. 13 is a schematic diagram showing a more concrete first structural example of the embodiment shown in FIG. 12.

FIG. 13 shows a schematic diagram showing a first concrete structural example of the first embodiment of a FET differential amplifying circuit shown in FIG. 12.

That is, in the circuit shown in FIG. 13, the constant current source $I_0$ is formed by a series circuit composed of the resistors $R_5$ and $R_6$ and the FET $T_5$ as compared with the FET differential amplifying circuit shown in FIG. 12. The drain terminal of the FET $T_5$ is connected to the source terminals of the FETs $T_1$ and $T_2$ via the resistor $R_5$. Further, the source terminal of the FET $T_5$ is grounded via the resistor $R_6$. Simultaneously, the gate terminal is grounded directly.

Further, the circuit forms the self-bias system by grounding the gate terminals via the resistors $R_3$ and $R_4$, respectively, instead of the gate bias voltage $V_g$ for supplying to the gate terminals of the FETs $T_1$ and $T_2$.

In such a circuit having the above-described structure, the voltage $V_g$ becomes useless, and it becomes possible to operate the circuit with only one voltage $V_{d1}$. Further, this circuit forms two of the complementary inputs and two of the complementary outputs.

Figure 14:
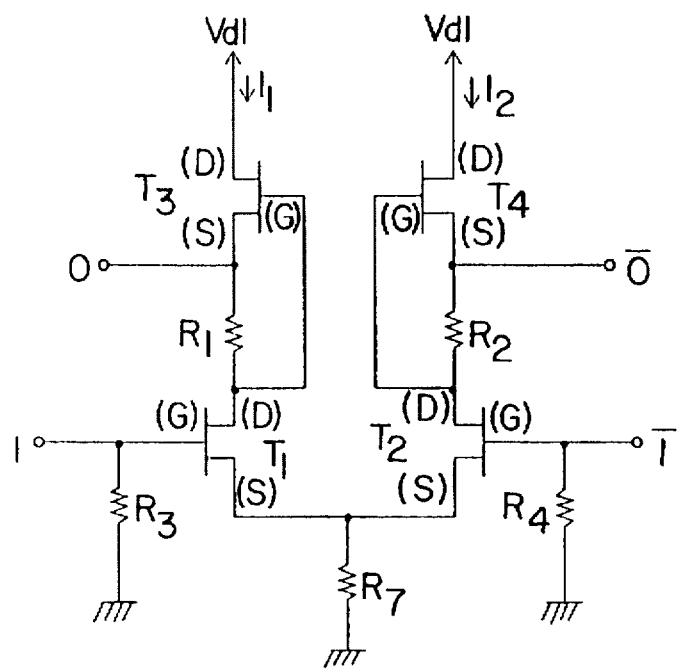
FIG. 14 is a schematic diagram showing a more concrete second structural example of the embodiment shown in FIG. 12.

FIG. 14 shows a schematic diagram showing a second concrete structure in the first embodiment of the FET differential amplifying circuit shown in FIG. 12.

As same as the structural example shown in FIG. 13, the circuit forms two of the complementary inputs and two of the complementary outputs. The circuit forms the self-bias system by grounding the gate terminals via the resistors $R_3$ and $R_4$, respectively, instead of supplying the gate bias voltage $V_g$ to the gate terminals of the FETs $T_1$ and $T_2$.

It is a different point that the constant current source $I_0$ is simplified with only the resistor $R_7$. If stability is not required exactly, it is possible to use only such one resistor, instead of the constant current source $I_0$.

Figure 15:
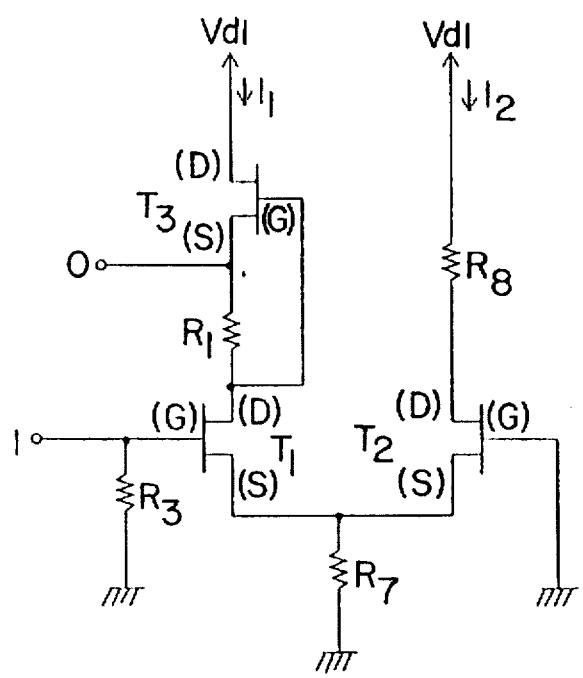
FIG. 15 is a schematic diagram showing a second embodiment of a FET differential amplifying circuit according to the present invention.

FIG. 15 shows a second embodiment of a FET differential amplifying circuit according to the present invention. This circuit forms one of single input and one of single output. A resistor $R_7$ is replaced instead of the current source $I_0$ of the FET differential amplifying circuit shown in the embodiment of FIG. 12, as same as the circuit shown in FIG. 14.

Further, the FET $T_1$ is grounded via the resistor $R_3$ instead of supplying the gate bias voltage $V_g$ to the gate terminals of the FETs $T_1$ and $T_2$. Meanwhile, the inverse input is not used in the $T_2$, so that the $T_2$ forms the self-bias system by grounding the gate directly.

In this embodying circuit, the inverse output of the right side of the circuit is not used. Therefore, the resistor $R_8$ is placed instead of the FET $T_4$ and the resistor $R_2$ shown in FIG. 12.

Figure 16:
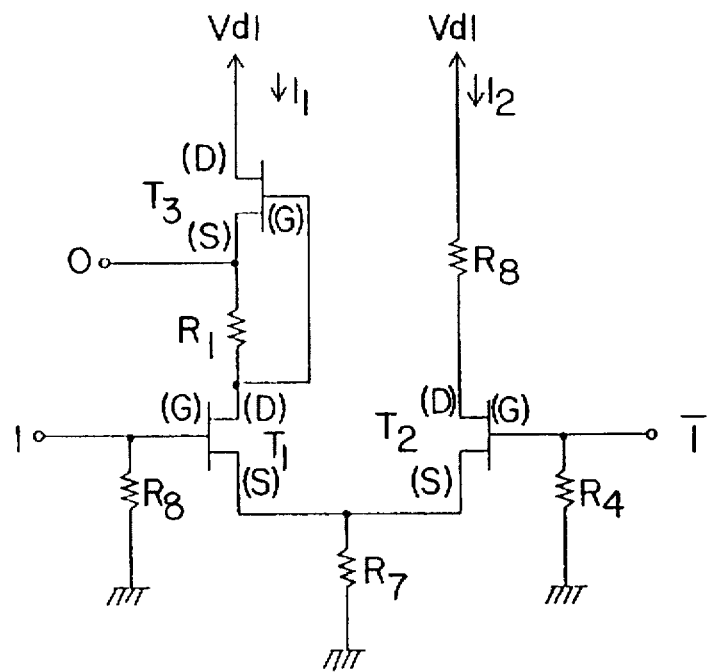
FIG. 16 is a schematic diagram showing a third embodiment of a FET differential amplifying circuit according to the present invention.

FIG. 16 shows a third embodiment of a FET differential amplifying circuit according to the present invention. This circuit has two complementary inputs and single output. The resistor $R_7$ is replaced instead of the current source $I_0$ of the FET differential amplifying circuit shown in the embodiment of FIG. 12, as same as the circuit of FIG. 14.

Further, the FET $T_1$ is grounded via the resistor $R_3$ instead of supplying the gate bias voltage $V_g$ to the gate terminals of FETs $T_1$ and $T_2$. Meanwhile, the FET $T_2$ to which the inverse input is given forms a self-bias system, in which the FET $T_2$ is grounded via the resistor $R_4$.

In this circuit, the inverse output of the right side of the circuit is not used. The resistor $R_8$ is replaced instead of the FET $T_4$ and the resistor $R_2$.

Figure 17:
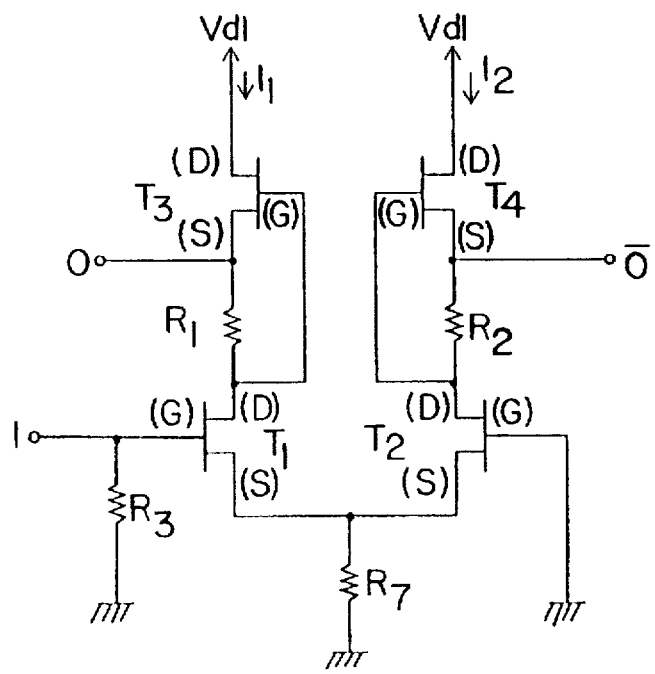
FIG. 17 is a schematic circuit showing a fourth embodiment of a FET differential amplifying circuit according to the present invention.

FIG. 17 shows a fourth embodiment of a FET differential amplifying circuit according to the present invention. This circuit forms single input and two complementary outputs. The resistor $R_7$ is replaced instead of the current source $I_0$ of the FET differential amplifying circuit shown in the embodiment of FIG. 12, as same as the circuit shown in FIG. 14.

Further, the FET $T_1$ is grounded via the resistor $R_3$ instead of supplying the gate bias voltage $V_g$ to the gate terminals of the FETs $T_1$ and $T_2$. Meanwhile, the inverse input is not used in the FET $T_2$, so that the circuit forms the self-bias system by connecting the gate of the FET $T_2$ directly to the ground.

Figure 18:
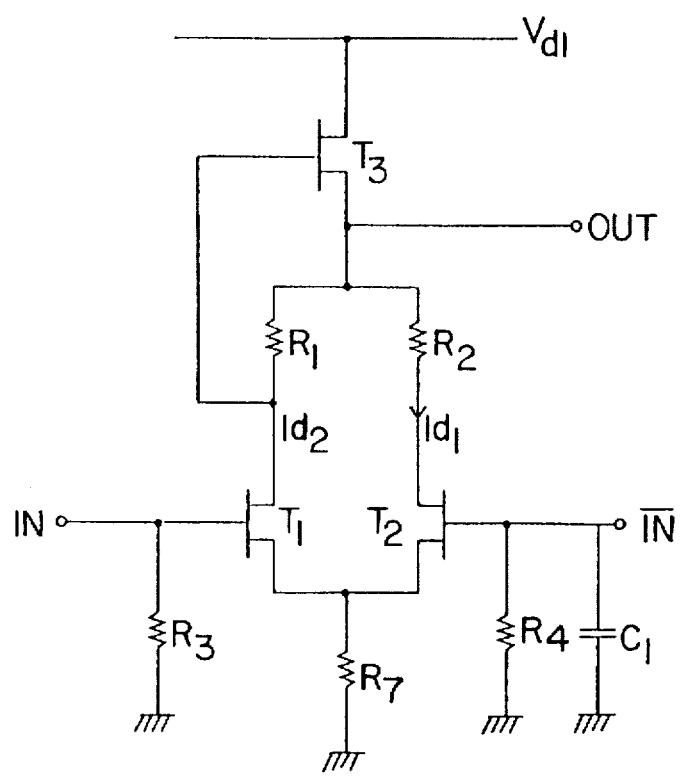
FIG. 18 is a schematic circuit showing a fifth embodiment of a FET differential amplifying circuit according to the present invention.

FIG. 18 shows a fifth embodiment of a FET differential amplifying circuit according to the present invention. The circuit forms two inputs and single output. In this embodiment, the load resistors $R_1$ and $R_2$ of the differential pair of FETs $T_1$ and $T_2$ are connected in common, and the FET $T_3$ is inserted between the connecting point of the resistors $R_1$ and $R_2$ and the voltage source $V_{d1}$.

Further, the gate terminal of the FET $T_3$ is directly connected to the drain terminal of The FET $T_1$, that is, one of the differential pair of the FETs $T_1$ and $T_2$. Accordingly, the FET $T_3$ works as source follower circuit. The gate terminals of the FETs $T_1$ and $T_2$ become the non-inverse input terminal I and the inverse input terminal /I. The self bias is given to the gate terminals by the resistors $R_3$ and $R_4$.

In the embodiment shown in FIG. 18, only the FET $T_3$ is provided between the differential pair of the FETs $T_1$ and $T_2$ and the voltage source to more simplify the structure of the circuit.

According to the FET differential amplifying circuits having the structures shown in FIGS. 12 through 18 as described above, the currents $I_1$ and the current $I_2$ flowing to the circuit become approximately a half of the current $I_{11}+I_{13}$ and the current $I_{12}+I_{14}$ in comparison with the conventional FET differential amplifying circuits shown in FIGS. 23 and 24.

Also, it is general to use a GaAs (gallium arsenide) FET much more as a FET in the high-frequency circuit. In the case where the amplifying circuit according to the present invention is integrated, the circuit can be a MMIC (Monolithic microwave integrated circuit) comprising FETs and resistors unitedly on a gallium arsenide wafer.

Further, it becomes possible to make the noise lower and make the consumptive current lower in the differential amplifying circuit by using a HEMT (High Electron Moving Transistor), of which noise is lower than that of the GaAs FET, as a FET.

According to the present invention the amplifying circuit of which noise is lower and consumptive current is lower can be presented. Further, amplifying elements such as transistors, FETs or HEMTs can be used according to the common principle of the present invention.

Therefore, it is possible to apply the present invention to each kind of amplifying circuits, that are indispensable in a compact type handy machine, more particularly, a portable telephone. Thus, it is apparent that the present invention greatly contributes industrial efficiency.

Although the present invention has been described with reference to embodiments, the present invention is not restricted to those. It should be of course understood that those which are the same as the technical concept of the invention are within the protective scope of this invention.

What is claimed is:

1. A FET differential amplifier circuit comprising;

a differential pair including first and second FETs, first and second resistors respectively connected to drains of the first and second FETs and a constant current source connected between commonly connected sources of the first and second FETs and ground, third and fourth FETs, sources of which are respectively connected to the first and second resistors and from the sources of which a non-inverted signal and an inverted signal are output, a voltage source connected to drains of the third and fourth FETs; and a gate bias source for supplying gate biases to the gates of the first and second FETs, the drain of the first FET being directly connected to the gate of the third FET, the drain of the second FET being directly connected to the gate of the fourth FET and the gates of the first and second FETs being supplied with a non-inverted input and an inverted input, respectively.

2. A FET differential amplifier circuit according to claim 1, wherein the constant current source that is provided between the commonly connected source of the first and second FETs and the ground includes a fifth FET, a third resistor connected to the drain of the fifth FET and a fourth resistor, one end of which is connected to a source of the fifth FET, the other end of the third resistor being connected to the commonly connected source of the first and second FETs and the other end of the fourth resistor being connected to the ground as well as a gate of the fifth FET.

3. A FET differential amplifier circuit according to claim 1, wherein the constant current source connected between the commonly connected source of the first and second FETs and the ground is a resistor, one end of which is connected to the ground and the other end of which is connected to the commonly connected source of the first and second FETs.

4. A FET differential amplifier circuit comprising:

a differential pair including first and second FETs, first and second resistors respectively connected to drains of the first and second FETs and a constant current source connected between commonly connected sources of the first and second FETs and ground, third and fourth FETs, sources of which are respectively connected to the first and second resistors and from the sources of which a non-inverted signal and an inverted signal are output, a voltage source connected to drains of the third and fourth FETs; and a first and second bias resistors respectively connected to gates of the first and second FETs, the drain of the first FET being directly connected to the gate of the third FET, the drain of the second FET being directly connected to the gate of the fourth FET and the gates of the first and second FETs being supplied with a non-inverted input and an inverted input, respectively.

5. A FET differential amplifier circuit comprising;

a differential pair including first and second FETs, first and second resistors respectively connected to drains of the first and second FETs and a constant current source connected between commonly connected sources of the first and second FETs and ground, third FET source of which is connected to the first resistor and from the source of which a signal is output; and a voltage source connected to drain of the third FET and the second resistor, the drain of the first FET being directly connected to gate of the third FET the gates of the first and second FETs being supplied with non-inverted and inverted inputs, respectively.

6. A FET differential amplifier circuit according to claim 1, wherein the gate of the second FET is provided with a ground potential from the gate bias source so that only the non-inverted input is supplied to the gate of the first FET.

7. A FET differential amplifier circuit according to claim 5, wherein the gate of the second FET is grounded so that only the non-inverted input is supplied to the gate of the first FET.

8. A FET differential amplifier circuit comprising:

a differential pair including first and second FETs, first and second resistors respectively connected to drains of the first and second FETs and a constant current source connected between commonly connected sources of the first and second FETs and ground, a third FET, a source of which is connected to the connection point of the other terminals of the first and second resistors and from the source of which a signal is output; and a voltage source connected to a drain of the third FET, the drain of the first FET being directly connected to a gate of the third FET, and the gates of the first and second FETs being supplied with non-inverted and inverted inputs, respectively.

* * * * *